United States Patent [19]

Jönsson et al.

[11] Patent Number: 5,963,434
[45] Date of Patent: Oct. 5, 1999

[54] ELECTRONIC DEVICE AND METHOD

[75] Inventors: Anders Jönsson, Apex, N.C.; Jeffrey F. Brady, Forest, Va.

[73] Assignee: Ericsson Inc., Research Triangle Park, N.C.

[21] Appl. No.: 09/032,062

[22] Filed: Feb. 27, 1998

[51] Int. Cl.6 ........................................... H05K 7/02
[52] U.S. Cl. ................... 361/814; 361/760; 361/767; 361/737; 361/782; 361/814; 174/260; 174/250; 439/68; 257/708; 455/90
[58] Field of Search ..................... 361/794, 760, 361/767, 777, 780, 782, 772, 774, 814, 737; 174/260, 261, 52.1, 250; 439/68, 82, 83, 179, 607, 901; 257/700, 723, 724; 455/90

[56] References Cited

U.S. PATENT DOCUMENTS

| | | | |
|---|---|---|---|
| 4,349,705 | 9/1982 | Kufus | 379/361 |
| 5,039,846 | 8/1991 | Komaki | 235/1 D |
| 5,357,065 | 10/1994 | Mitamura et al. | 200/5 A |
| 5,711,588 | 1/1998 | Rudisill | 362/30 |
| 5,739,880 | 4/1998 | Suzuki et al. | 349/110 |
| 5,804,780 | 9/1998 | Bartha | 200/5 A |

*Primary Examiner*—Leo P. Picard
*Assistant Examiner*—David Foster
*Attorney, Agent, or Firm*—Nixon & Vanderhye P.C.

[57] ABSTRACT

In a liquid crystal display (LCD) unit for a cellular phone or the like, the conventional reflection tape attached to the lightguide is eliminated in favor of a reflection strip disposed on a reflection area of the printed circuit board (PCB). The reflection strip serves to reflect light from the PCB back to the LCD display area and/or the keys of the keypad. By eliminating the reflection tape, manufacturing is made easier and manufacturing costs are reduced.

19 Claims, 5 Drawing Sheets

ELECTRONIC DEVICE AND METHOD

BACKGROUND OF THE INVENTION

The present invention relates to an electronic device and its method of manufacture and, in particular, to an electronic device such as a liquid crystal display unit and/or a cellular phone wherein the conventional light reflection tape is eliminated from the lightguide in favor of a reflection strip on the printed circuit board.

FIG. 1 illustrates a conventional liquid crystal display unit including a printed circuit board (PCB) 12, a lightguide 14, and a liquid crystal display (LCD) 16. Suitably sized reflection tape 18 is secured to the back side of the lightguide 14 for reflecting light from the PCB 12 back to the display area of the LCD 16. Some conventional constructions also secure such reflection tape 18 in the area of the keypad to increase the effectiveness of the light source.

The reflection tape 18 evenly disperses the light from diode lenses in the lightguide. Conventionally, there is provided on the PCB 12 different types of gold-plated conductors and via-holes. These conductors and via-holes can be seen through the LCD 16 in the absence of the reflection tape 18. Thus, the reflection tape 18 in the area of the LCD 16 also serves to cover the smaller gold-plated surfaces and via-holes on the PCB 12.

During assembly, affixing the reflection tape 18 to the lightguide 14 requires expensive, high-performance equipment. Because of high-volume production, often more than one assembly unit is required at a single manufacturing location. Moreover, affixing the reflection tape 18 to the lightguide 14 is an intricate process. Consequently, by eliminating the tape, the price of the lightguide can be significantly reduced. Moreover, without the reflection tape, more manufacturers will have the capability to produce the lightguides as the manufacturers need only injection mold the lightguide, and it is ready for assembly into a liquid crystal display unit for, for example, cellular phones and the like.

SUMMARY OF THE INVENTION

The problem remains, however, that if the reflection tape is eliminated, the quality of the liquid crystal display unit and/or an illumination area of a cellular phone would be significantly reduced. Thus, according to the present invention, it is an object of the invention to provide an electronic device including no reflection tape that maintains the quality of the display or illumination. It is another object of the invention to achieve this structure with easily molded materials that do not require expensive, high-performance equipment, such as is the case with the assembly for affixing the conventional reflection tape to the lightguide.

In accordance with the present invention, the reflection tape is replaced with a consistent and continuous plated copper trace or a layer of white marking material. The plated copper trace or marking material is disposed in a reflection area defined by an apparatus component such as the liquid crystal display of the liquid crystal display unit and/or the keypad of the cellular phone. In one arrangement, copper is plated with gold plating as the reflection strip. As the cost of a PCB is not based on the amount of gold plating, the additional plating has a negligible if any affect on the cost of the board. In each arrangement, by eliminating the reflection tape, however, significant savings and improved manufacturability can be obtained.

These and other objects of the invention are achieved by providing an electronic device including a printed circuit board (PCB), an apparatus component coupled with the PCB, the apparatus component defining a reflection area on the PCB, and a reflection strip disposed on the reflection area of the PCB. A lightguide may also be provided, wherein in this arrangement, there is no reflection tape affixed to the lightguide. In one arrangement, the reflection strip is disposed covering an entire portion of the reflection area. The PCB may be provided with conductors and via-holes, wherein the plated conductors and the via-holes are formed outside of the reflection area. In another arrangement, the PCB is formed of a plurality of layers, and the plated conductors and the via holes are formed in a layer of the PCB different from the reflection area. When the reflection strip is formed with a conductive material such as gold, the reflection strip can be utilized as a ground plane.

In accordance with another aspect of the invention, there is provided a method of manufacturing the electronic device according to the invention. The method includes the steps of coupling the apparatus component with the PCB, the apparatus component defining a reflection area on the PCB, and disposing a reflection strip on the reflection area of the PCB.

In accordance with yet another aspect of the present invention, there is provided an electronic device including a PCB, a lightguide coupled with the PCB, and an apparatus component attached to the lightguide and coupled with the PCB. The apparatus component defines a reflection area on the PCB, wherein no reflection tape is affixed to the lightguide. The electronic device may further include a reflection strip disposed on the reflection area of the PCB.

BRIEF DESCRIPTION OF THE DRAWINGS

These and other aspects and advantages of the present invention will be described in detail with reference to the accompanying drawings, in which.

DETAILED DESCRIPTION OF PREFERRED EMBODIMENTS

Figure 1:
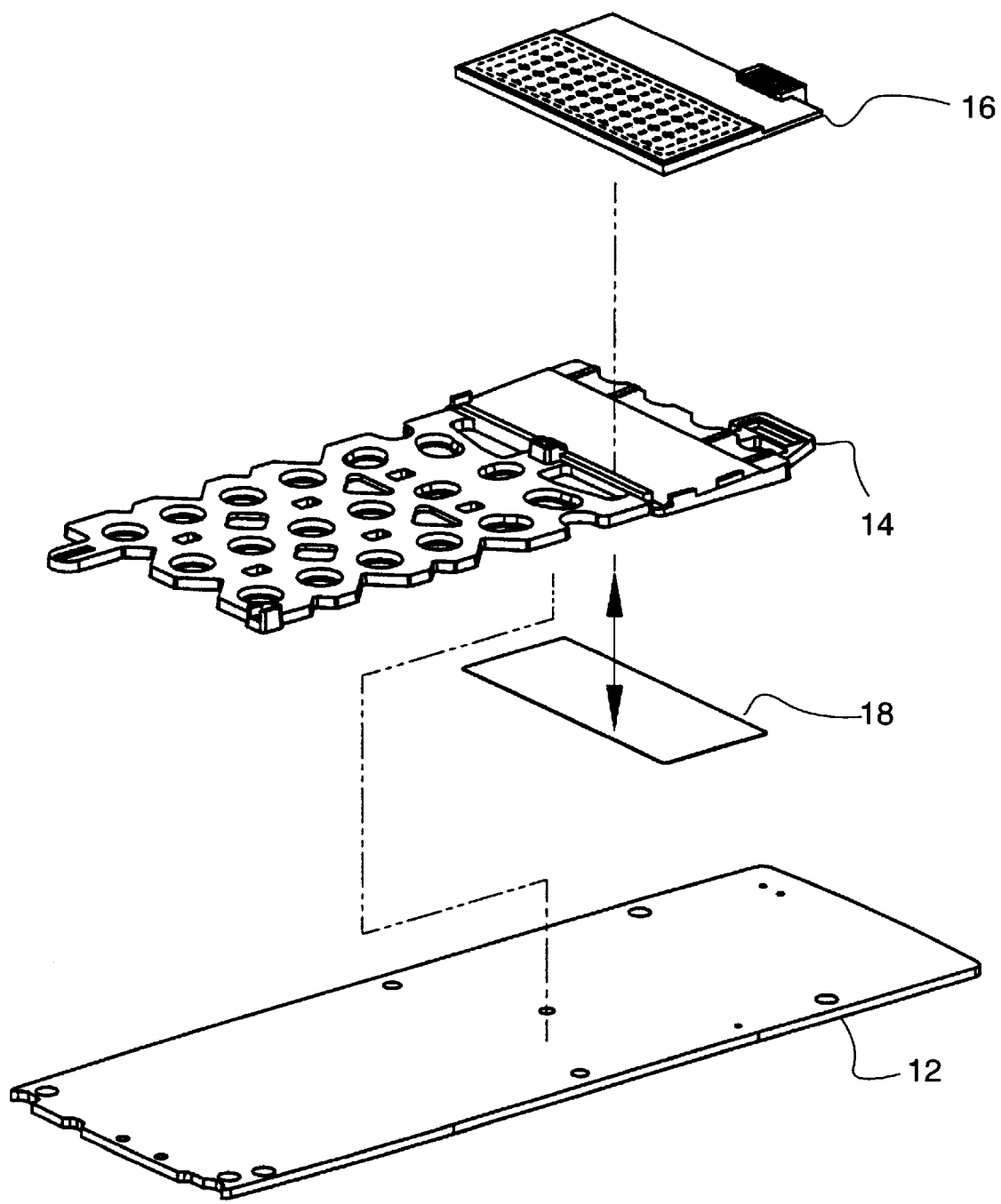
FIG. 1 is an assembly drawing of a conventional liquid crystal display unit.
Figure 2:
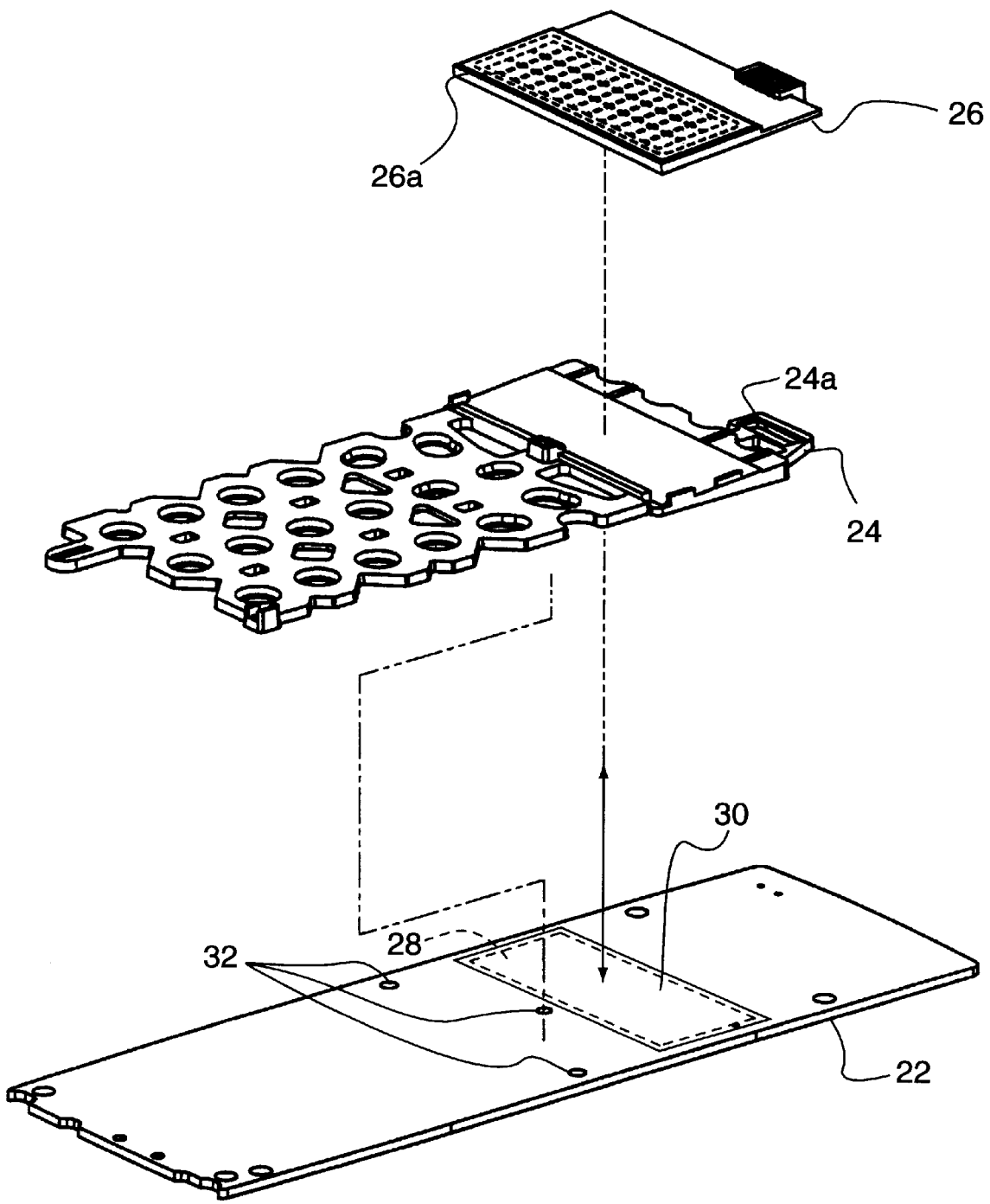
FIG. 2 is an assembly drawing of the liquid crystal display unit according to the present invention.

As shown in FIG. 2, in the liquid crystal display unit according to the present invention, the conventional reflection tape, as shown in FIG. 1, has been eliminated. The liquid crystal display unit according to the invention includes a printed circuit board (PCB) 22, a lightguide 24, and a liquid crystal display (LCD) 26. In FIG. 2, the liquid crystal display unit is illustrated in accordance with an application to a cellular phone. Of course, those of ordinary skill in the art will contemplate alternative uses for the liquid crystal display unit according to the invention, and the invention is not meant to be limited to the described and illustrated application.

As assembled, the lightguide 24 is coupled with the PCB 22, and the LCD 26 is attached to the lightguide 24 and coupled with the PCB 22 via an electrical connector access 24a in the lightguide 24.

The LCD 26 defines a reflection area 28 on the PCB 22. The reflection area 28 encompasses any area where light can reflect off of the PCB 22 back to the display area of the LCD 26. This reflection area is typically the area aligned with the display area 26a of the LCD 26. A reflection strip 30 is disposed on the reflection area 28 of the PCB 22, preferably covering the entire reflection area. In preferred forms, the reflection strip 30 is formed of plated copper during a molding process of the PCB. The plated copper reflection strip may be plated with any suitable materials, such as, for example, nickel and gold, an organic surface protection such as a lacquer, palladium, nickel and palladium, silver, tin/lead or the like.

In an alternative arrangement, the reflection strip 30 is comprised of white marking material that is coated over the reflection area 28. The coating may be applied by any suitable method such as by screening or silk screening, stenciling or the like. This marking material is formed of an epoxy ink and is currently applied to the PCB 22 for identifying the board and/or the components attached to the board. Consequently, the application of the reflection strip can be simultaneously accomplished, thereby reducing manufacturing time and costs. In addition, the white marking material reflects light effectively while eliminating any need to electrically alter the PCB.

In operation, the LCD 26 is illuminated by a plurality of diodes (not shown), which are conventionally located near the semi-circular areas in the lightguide. Light passing through the lightguide 24 reaches the reflection area 28 of the PCB 22 and is reflected from the PCB 22 back to the LCD 26 by the reflection strip 30.

Figure 3:
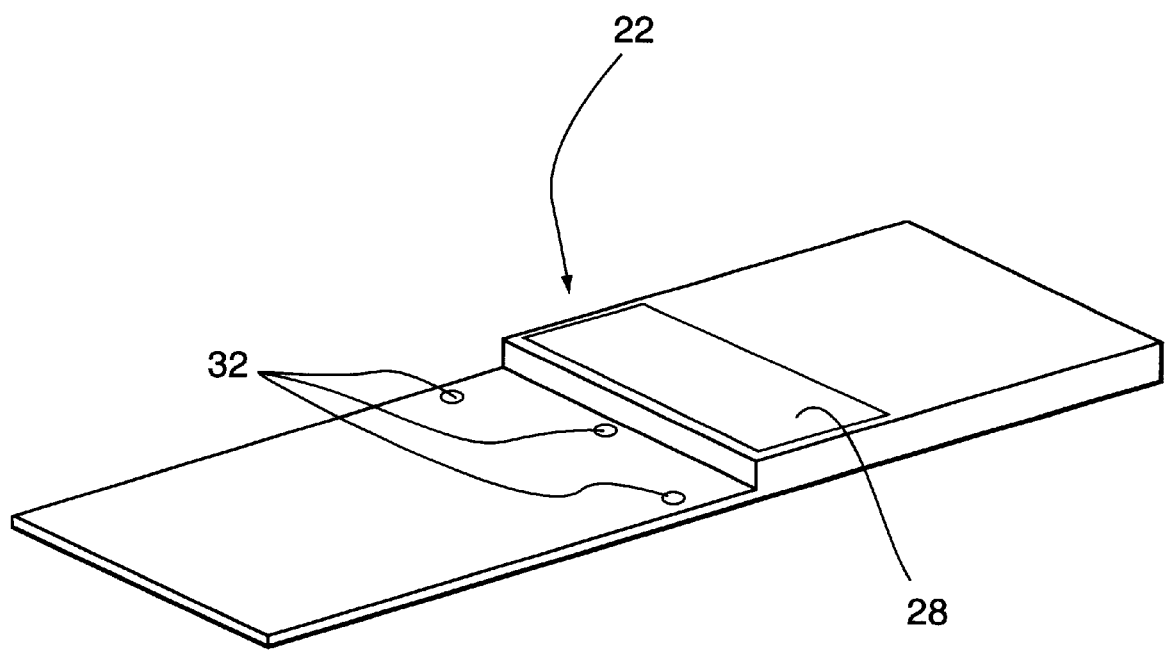
FIG. 3 illustrates a layered PCB in accordance with the present invention.

With continued reference to FIG. 2, plated conductors and via-holes 32 are formed in the PCB 22 outside of the reflection area 28. Alternatively, the PCB 22 may be formed of a plurality of layers, and the plated conductors and via-holes formed in the PCB 22 are formed in a layer of the PCB 22 different from the reflection area 28 (see FIG. 3). When the reflection strip 30 is formed with a conductive material such as gold, the reflection strip 30 may be utilized as a ground plane.

Figure 4:
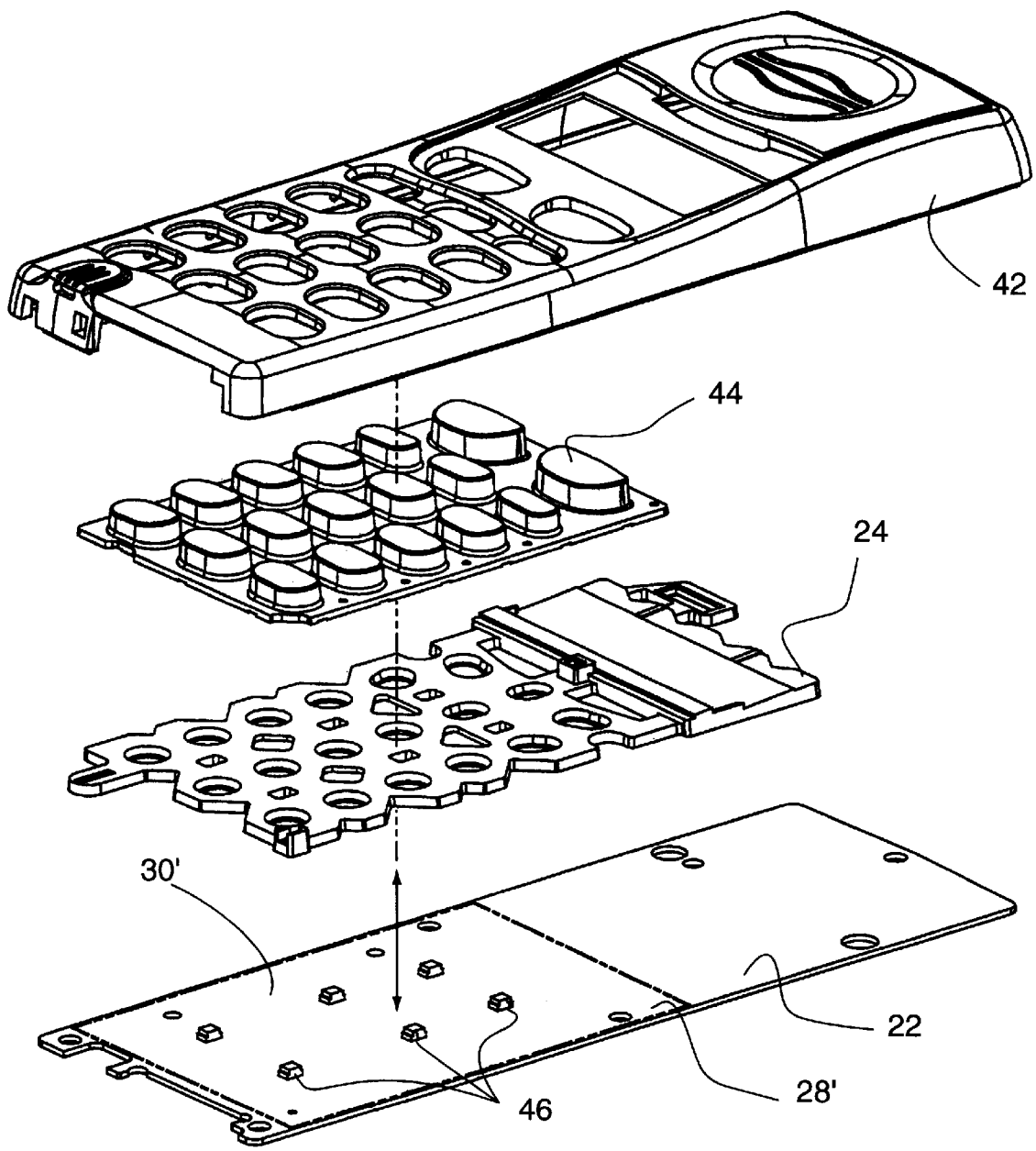
FIG. 4 is an assembly drawing of a cellular phone according to an alternative embodiment of the invention.
Figure 5:
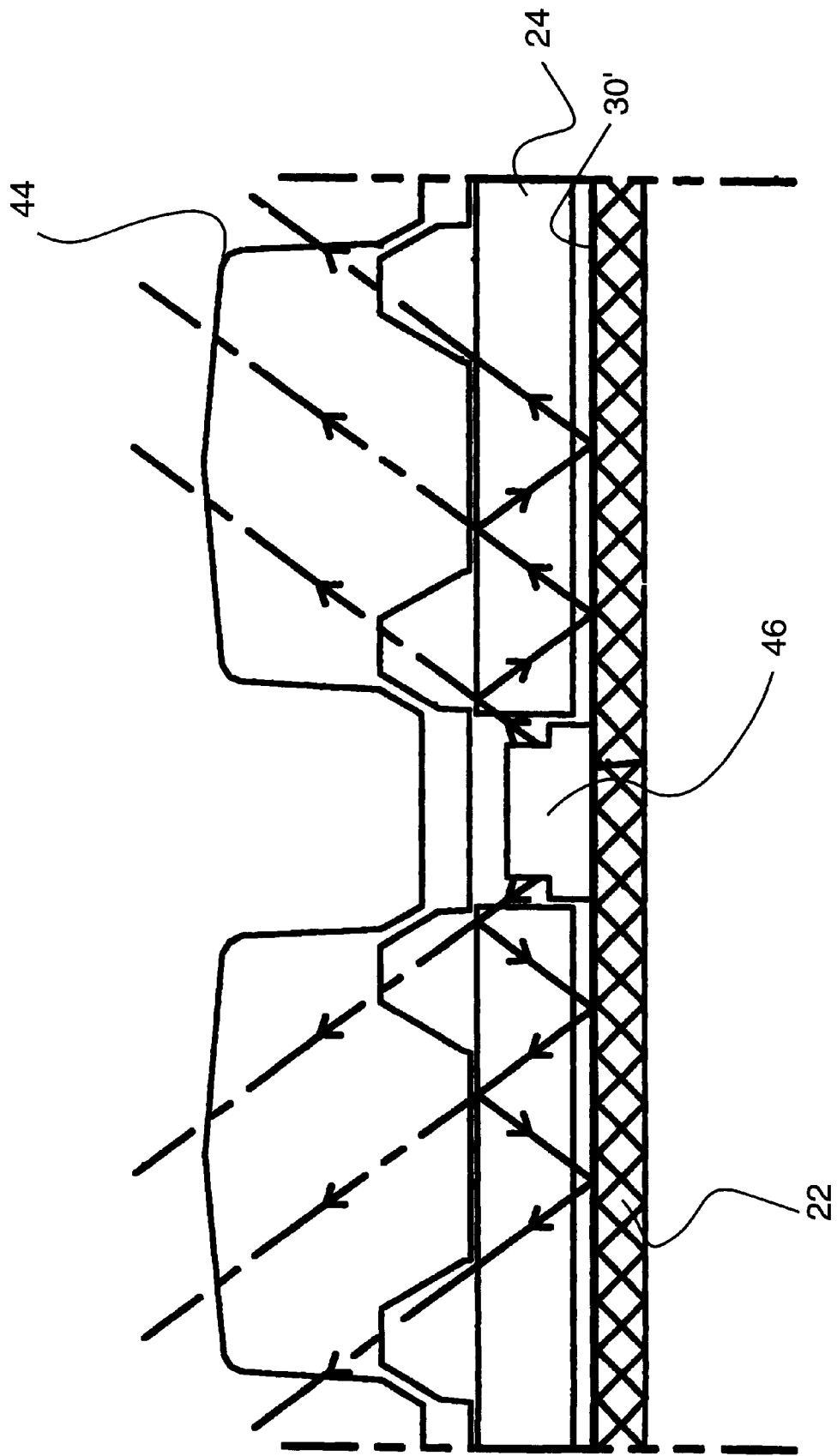
FIG. 5 is a cross-sectional illustration of the embodiment illustrated in FIG. 4.

An alternative arrangement is illustrated in FIGS. 4 and 5 in conjunction with an application to a cellular phone. The cellular phone includes a phone casing 42 (only the front casing shown in FIG. 4) and a keypad 44 along with the liquid crystal display unit described above including the lightguide 24 and the PCB 22. The keypad 44 is operatively coupled with the PCB 22 in a known manner.

In this arrangement, the reflection area 28' is alternatively or additionally defined by an area of the keypad 44. The reflection strip 30' is formed in the reflection area 28'. In the cellular phone, a plurality of LED diodes 46 serve to illuminate the keypad area, and the reflection strip 30' improves the dispersion of light through the keys of the keypad 44.

By virtue of the elimination of the reflection tape and incorporation of the reflection strip on the PCB, the PCB for a lightguide assembly and/or a cellular phone can be manufactured in a single production process, thereby saving manufacturing costs and time. The elimination of the reflection tape itself also saves manufacturing costs. The reflection strip formed with the PCB serves to reflect light from the PCB back to the LCD display area and/or the keys of the keypad, thereby maintaining high-quality display and illumination properties.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. An electronic device comprising:
   a printed circuit board (PCB);
   an apparatus component coupled with said PCB, said apparatus component defining a reflection area on said PCB; and
   a reflection strip formed on said reflection area of said PCB.

2. An electronic device according to claim 1, wherein said reflection strip comprises plated copper.

3. An electronic device according to claim 2, wherein said plated copper is plated with nickel and gold.

4. An electronic device according to claim 2, wherein said plated copper is plated with one of an organic surface protection, palladium, nickel and palladium, silver, and tin/lead.

5. An electronic device according to claim 1, wherein said reflection strip comprises marking material.

6. An electronic device according to claim 1, wherein said reflection strip is formed with a conductive material, said reflection strip being utilized as a ground plane.

7. An electronic device according to claim 1, further comprising a lightguide coupled with the PCB, wherein said apparatus component comprises at least one of a liquid crystal display and a keypad coupled with the PCB, wherein no reflection tape is affixed to said lightguide.

8. An electronic device according to claim 1, wherein said reflection strip is disposed entirely covering said reflection area.

9. An electronic device according to claim 1, further comprising plated conductors and via-holes formed in said PCB, said plated conductors and said via-holes being formed outside of said reflection area.

10. An electronic device according to claim 1, further comprising plated conductors and via-holes formed in said PCB, said PCB comprising a plurality of layers, wherein said plated conductors and said via-holes are formed in a layer of said PCB different from said reflection area.

11. An electronic device according to claim 1, wherein said apparatus component comprises at least one of a liquid crystal display and a keypad.

12. An electronic apparatus comprising:
    a printed circuit board (PCB);
    a lightguide coupled with the PCB; and
    an apparatus component attached to said lightguide and coupled with said PCB, said apparatus component defining a reflection area on said PCB, wherein no reflection tape is affixed to said lightguide.

13. An electronic device according to claim 12, further comprising a reflection strip formed on said reflection area of said PCB.

14. An electronic device according to claim 13, wherein said reflection strip comprises a plated copper.

15. An electronic device according to claim 14, wherein said plated copper is plated with nickel and gold.

16. An electronic device according to claim 14, wherein said plated copper is plated with one of an organic surface protection, palladium, nickel and palladium, silver, and tin/lead.

17. An electronic device according to claim 13, wherein said reflection strip comprises marking material.

18. An electronic device according to claim 13, wherein said reflection strip is formed with a conductive material, said reflection strip being utilized as a ground plane.

19. An electronic device according to claim 12, wherein said apparatus component comprises at least one of a liquid crystal display and a keypad.

* * * * *